(12) United States Patent
Patel et al.

(10) Patent No.: US 11,974,031 B1
(45) Date of Patent: Apr. 30, 2024

(54) HYBRID SENSOR SHIFT PLATFORM WITH MULTI-CORE SUBSTRATE FOR CAMERA

(71) Applicant: Apple Inc., Cupertino, CA (US)

(72) Inventors: Himesh Patel, Cupertino, CA (US); Roshan Murthy, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 210 days.

(21) Appl. No.: 17/715,850

(22) Filed: Apr. 7, 2022

Related U.S. Application Data

(60) Provisional application No. 63/176,118, filed on Apr. 16, 2021.

(51) Int. Cl.
| | |
|---|---|
| *H04N 23/54* | (2023.01) |
| *G02B 27/64* | (2006.01) |
| *G03B 13/36* | (2021.01) |
| *H02K 41/035* | (2006.01) |
| *H04N 23/55* | (2023.01) |
| *H04N 23/68* | (2023.01) |
| *H10K 39/32* | (2023.01) |

(52) U.S. Cl.
CPC .......... *H04N 23/54* (2023.01); *G02B 27/646* (2013.01); *G03B 13/36* (2013.01); *H04N 23/55* (2023.01); *H04N 23/687* (2023.01); *H10K 39/32* (2023.02); *G03B 2205/0069* (2013.01); *H02K 41/0354* (2013.01)

(58) Field of Classification Search
CPC ........ H04N 23/50; H04N 23/51; H04N 23/52; H04N 23/54; H04N 23/55; H04N 23/57; H04N 23/685; H04N 23/687; G02B 27/64; G02B 27/646; G03B 2205/0007; G03B 2205/0015; G03B 2205/0038; G03B 2205/0053; G03B 2205/0069; G03B 13/36; G03B 17/02; G03B 30/00; G03B 2217/00; G03B 2217/002; H10K 39/32; H02K 41/0354; H02K 41/0356
See application file for complete search history.

(56) References Cited

U.S. PATENT DOCUMENTS

| | | | |
|---|---|---|---|
| 2008/0289866 | A1 | 11/2008 | Yuri et al. |
| 2017/0280558 | A1* | 9/2017 | Ohara ................... G03B 17/55 |
| 2019/0393109 | A1 | 12/2019 | Chen et al. |
| 2021/0028216 | A1* | 1/2021 | Hubert .................. H04N 23/55 |

FOREIGN PATENT DOCUMENTS

| | | |
|---|---|---|
| CN | 2641824 | 9/2004 |
| JP | 5598212 | 8/2014 |

* cited by examiner

*Primary Examiner* — Twyler L Haskins
*Assistant Examiner* — Akshay Trehan
(74) *Attorney, Agent, or Firm* — Robert C. Kowert; Kowert, Hood, Munyon, Rankin & Goetzel, P.C.

(57) ABSTRACT

Various embodiments include a hybrid sensor shift platform comprising a multi-core substrate for a camera. The hybrid sensor shift platform may be coupled with an image sensor. The camera may include one or more actuators configured to move the hybrid sensor shift platform together with the image sensor. The multi-core substrate may be coupled with one or more other substrates to form the hybrid sensor shift platform. For example, the hybrid sensor shift platform may include a multi-core organic substrate and a ceramic substrate in various embodiments.

20 Claims, 9 Drawing Sheets

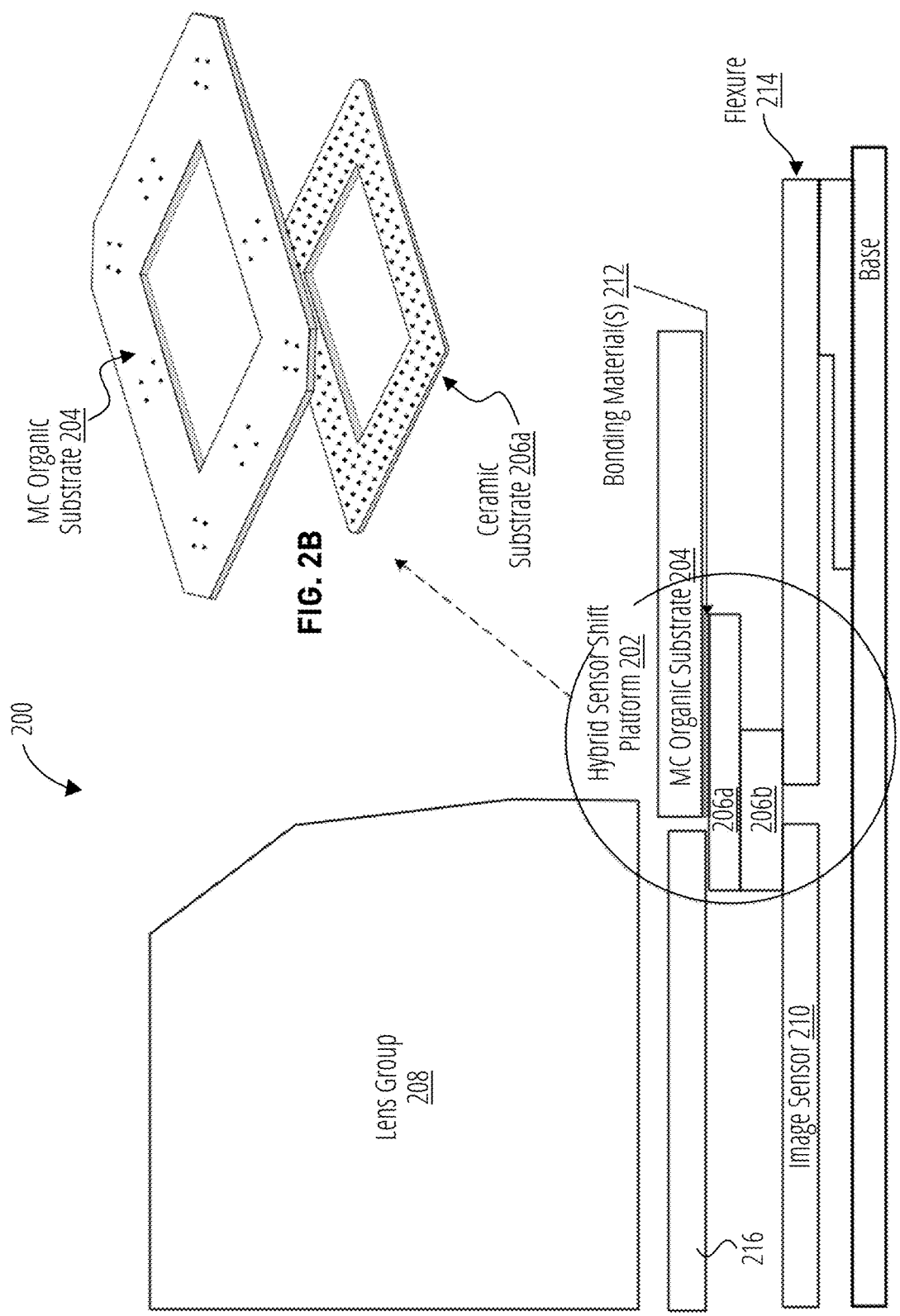

HYBRID SENSOR SHIFT PLATFORM WITH MULTI-CORE SUBSTRATE FOR CAMERA

BACKGROUND

This application claims benefit of priority to U.S. Provisional Application Ser. No. 63/176,118, entitled "Hybrid Sensor Platform with Multi-Core Substrate for Camera," filed Apr. 16, 2021, and which is hereby incorporated herein by reference in its entirety.

TECHNICAL FIELD

This disclosure relates generally to a hybrid sensor shift platform with a multi-core substrate for a camera.

DESCRIPTION OF THE RELATED ART

The advent of small, mobile multipurpose devices such as smartphones and tablet or pad devices has resulted in a need for high-resolution, small form factor cameras for integration in the devices. Some small form factor cameras may incorporate optical image stabilization (OIS) mechanisms that may sense and react to external excitation/disturbance by adjusting location of the optical lens on the X and/or Y axis in an attempt to compensate for unwanted motion of the lens. Some small form factor cameras may incorporate an autofocus (AF) mechanism whereby the object focal distance can be adjusted to focus an object plane in front of the camera at an image plane to be captured by the image sensor. In some such autofocus mechanisms, the optical lens is moved as a single rigid body along the optical axis of the camera to refocus the camera.

BRIEF DESCRIPTION OF THE DRAWINGS

FIG. 1A shows a perspective view of an example exterior of the camera.

FIG. 1B shows a block diagram of example camera components.

FIGS. 2A-2B illustrate an example camera that may include a hybrid sensor shift platform comprising one or more multi-core organic substrates and one or more ceramic substrates, in accordance with some embodiments. FIG. 2A shows a cross-sectional view of the camera. FIG. 2B shows an exploded perspective view of a multi-core organic substrate and a ceramic substrate of the hybrid sensor shift platform.

Figures 1A, 1B:
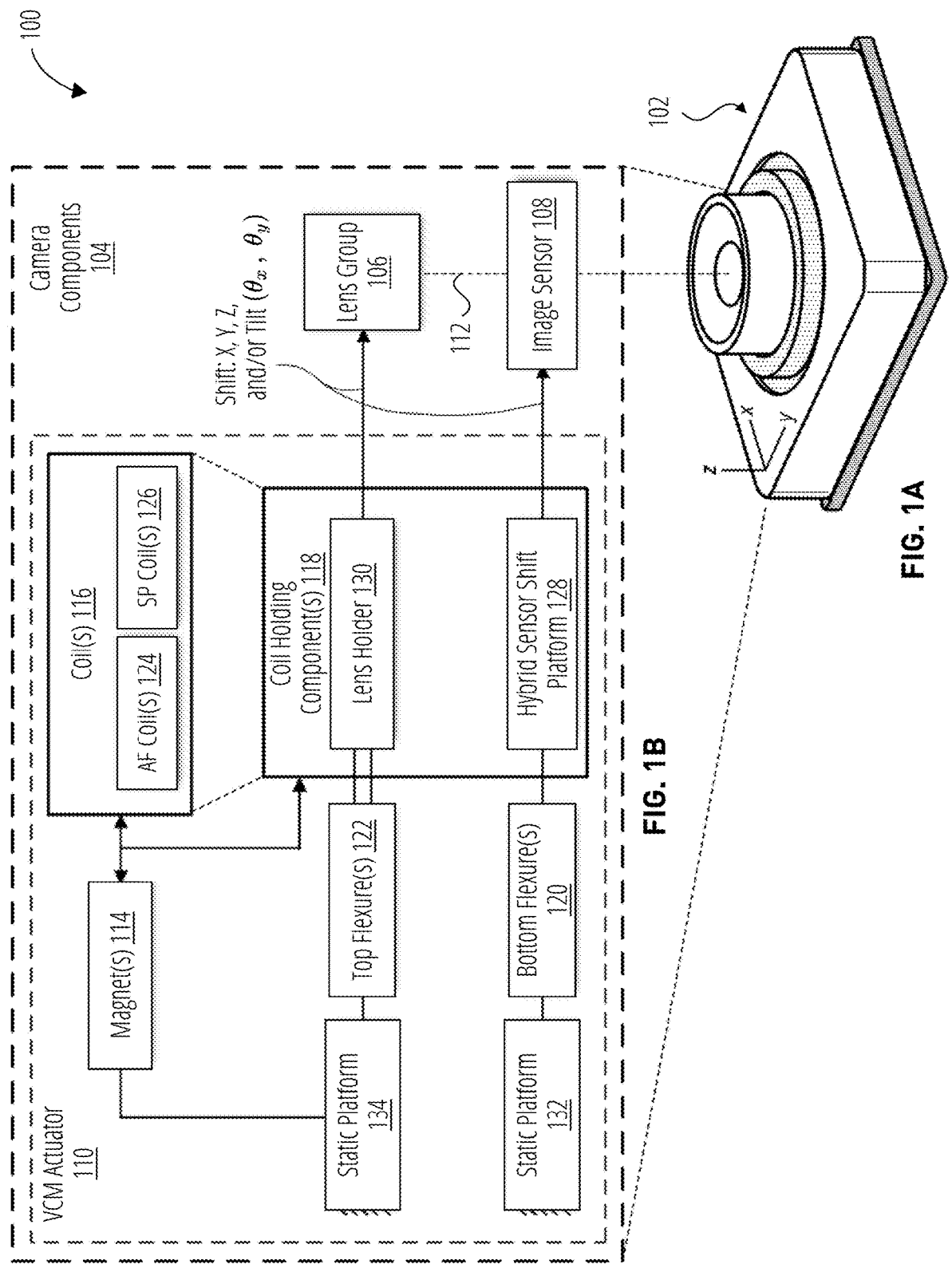
FIGS. 1A-1B illustrate an example camera that may include a hybrid sensor shift platform comprising a multi-core substrate, in accordance with some embodiments.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

"Comprising." This term is open-ended. As used in the appended claims, this term does not foreclose additional structure or steps. Consider a claim that recites: "An apparatus comprising one or more processor units . . . ." Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112(f) for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, a buffer circuit may be described herein as performing write operations for "first" and "second" values. The terms "first" and "second" do not necessarily imply that the first value must be written before the second value.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

It will also be understood that, although the terms first, second, etc. may be used herein to describe various elements, these elements should not be limited by these terms. These terms are only used to distinguish one element from another. For example, a first contact could be termed a second contact, and, similarly, a second contact could be termed a first contact, without departing from the intended scope. The first contact and the second contact are both contacts, but they are not the same contact.

The terminology used in the description herein is for the purpose of describing particular embodiments only and is not intended to be limiting. As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

DETAILED DESCRIPTION

Various embodiments include a hybrid sensor shift platform with a multi-core substrate for a camera. A "hybrid sensor shift platform" may refer to a sensor shift platform in which at least one substrate of the sensor shift platform is composed of an organic material, and one or more substrates of the sensor shift platform are ceramic substrates that provide the benefits of ceramics for connection to the image sensor, e.g., as discussed in Applicant's U.S. Patent Publication No. 2021/0028216, which is incorporated by reference in its entirety herein. In the event of inconsistent usages between the instant disclosure and the document(s) incorporated by reference, the usage in the incorporated reference(s) should be considered supplementary to that of this disclosure; for irreconcilable inconsistencies, the usage in this disclosure controls.

The hybrid sensor shift platform may be coupled with an image sensor. The camera may include one or more actuators configured to move the image sensor (together with the hybrid sensor shift platform), e.g., to provide autofocus (AF) and/or optical image stabilization (OIS) motion of an image on the image sensor. The multi-core substrate may be coupled with one or more other substrates (e.g., a different type of substrate) to form the hybrid sensor shift platform. For example, the hybrid sensor shift platform may include a multi-core organic substrate and a ceramic substrate in various embodiments. The multi-core organic substrate may include multiple core layers, one or more conductive layers, and/or one or more other types of layers (e.g., prepreg layers).

The multi-core organic substrate may be designed to include multiple core layers (instead of a single core layer, for example) for warpage performance purposes. In some examples, one or more high-temperature processes (e.g., a high-temperature reflow process) may be used in attaching the ceramic substrate to the multi-core organic substrate. During such an attachment process, were the organic substrate to have a significantly different average CTE than the ceramic substrate, the resulting hybrid sensor shift platform may have poor flatness (e.g., U-shaped, where flatness is desirable) and/or other warpage problems. As an example, a single-core organic substrate having a single core layer may have a significantly higher average CTE than the ceramic substrate. The single-core organic substrate may experience substantial warpage during a high-temperature attachment process. The ceramic substrate may warp to the single-core organic substrate's (warped) flatness, and relaxation of the single-core organic substrate may be constrained because it is attached to the ceramic substrate.

By comparison, the hybrid sensor shift platform disclosed herein, which includes a multi-core organic substrate, may be designed such that its average CTE more closely aligned with the CTE of the ceramic substrate. For example, the average CTE of the multi-core organic substrate may be tuned via the inclusion of multiple distributed core layers and/or performance of conductive material balancing so that the average CTE of the multi-core organic substrate is within a threshold CTE difference with the CTE of the ceramic substrate. The average CTE of the multi-core organic substrate, the CTE of the ceramic substrate, and/or the threshold CTE difference may be determined based at least in part on design requirements and/or design constraints for a particular application of the hybrid sensor shift platform.

Reference will now be made in detail to embodiments, examples of which are illustrated in the accompanying drawings. In the following detailed description, numerous specific details are set forth in order to provide a thorough understanding of the present disclosure. However, it will be apparent to one of ordinary skill in the art that some embodiments may be practiced without these specific details. In other instances, well-known methods, procedures, components, circuits, and networks have not been described in detail so as not to unnecessarily obscure aspects of the embodiments.

FIGS. 1A-1B illustrate an example camera 100 that may include a hybrid sensor shift platform comprising a multi-core substrate, in accordance with some embodiments. FIG. 1A shows a perspective view of an example exterior 102 of the camera 100. FIG. 1B shows a block diagram of example camera components 104.

In some embodiments, the camera components 104 may include a lens group 106, an image sensor 108, and an actuator (e.g., voice coil motor (VCM) actuator 110). The lens group 106 may include one or more lens elements that define an optical axis 112. The image sensor 108 may be configured to receive light that has passed through the lens group 106 and convert the captured light into image signals. In some embodiments, the VCM actuator 110 may include one or more magnets 114, one or more coils 116, one or more coil holding component(s) 118, one or more bottom flexures 120, and/or one or more top flexures 122.

The magnets 114 and the coils 116 may be configured to electromagnetically interact with one another, e.g., to produce Lorentz forces that cause one or more of the coil holding components 118 to shift along multiple axes. For instance, a coil holding component 118 may move in directions orthogonal to the optical axis 112 (e.g., along the X-Y plane) to provide optical image stabilization (OIS) functionality in some embodiments. Additionally, or alternatively, a coil holding component 118 may move along the optical axis (e.g., along the Z axis) to provide autofocus (AF) functionality in some embodiments. Additionally, or alternatively, a coil holding component 118 may tilt relative to the optical axis (e.g., along the X- and Y-axes). In various examples, the lens group 106 and/or the image sensor 108 may be configured to shift together (e.g., in lockstep) with respective coil holding component(s) 118.

The coil(s) 116 may include AF coil(s) 124 and sensor positioning (SP) coil(s) 126. In some embodiments, the coil holding component(s) 118 may include a hybrid sensor shift platform 128 (e.g., the hybrid sensor shift platform comprising a multi-core substrate) and a lens holder 130. For instance, the hybrid sensor shift platform 128 may be configured to hold at least one SP coil 126, and the lens holder 130 may be configured to hold at least one AF coil 124. The hybrid sensor shift platform 128 may be coupled with the image sensor 108 such that the image sensor 108 shifts together with the hybrid sensor shift platform 128. Furthermore, the lens holder 130 may be coupled with the lens group 106 such that the lens group 106 shifts together with the lens holder 130.

In some embodiments, the bottom flexure(s) 120 may be configured to mechanically connect the hybrid sensor shift platform 128 to one or more stationary structures of the camera 100 (e.g., static platform 132). For example, the bottom flexure(s) 120 may be configured to suspend the hybrid sensor shift platform 128 (together with the image sensor 108) from the static platform 132. The bottom flexure(s) 120 may also be configured to provide compliance that allows motion of the hybrid sensor shift platform 128 enabled by the VCM actuator 110.

In some embodiments, the top flexure(s) 122 may be configured to mechanically connect the lens holder 130 to one or more stationary structures of the camera 100 (e.g., static platform 134). For example, the top flexure(s) 122 may be configured to suspend the lens holder 130 (together with the lens group 106) from the static platform 134. The top flexure(s) 122 may also be configured to provide compliance that allows movement of the hybrid sensor shift platform 128 enabled by the VCM actuator 110.

The AF coil(s) 124 may receive a current and electromagnetically interact with the magnet(s) 114 to produce Lorentz forces that cause the lens holder 130 to shift. For instance, electromagnetic interaction between the AF coil(s) 124 and the magnet(s) 114 may produce Lorentz forces that cause the lens holder 130 to move in a direction parallel to the optical axis 112 and/or to tilt relative to the optical axis 112. The lens group 106 may shift together (e.g., in lockstep) with the lens holder 130.

Furthermore, the SP coil(s) 126 may receive a current and electromagnetically interact with the magnet(s) 114 to produce Lorentz forces that cause the hybrid sensor shift platform 128 to shift. For instance, electromagnetic interaction between the SP coil(s) 126 and the magnet(s) 114 may produce Lorentz forces that cause the hybrid sensor shift platform 128 to move in directions orthogonal to the optical axis 112. The image sensor 108 may shift together (e.g., in lockstep) with the hybrid sensor shift platform 128.

FIGS. 2A-2B illustrate an example camera 200 that may include a hybrid sensor shift platform 202 (e.g., hybrid sensor shift platform 128) formed from one or more organic substrates (e.g., including a multi-core organic substrate 204) and one or more ceramic substrates (e.g., ceramic substrate 206a and/or ceramic substrate 206b). FIG. 2A shows a cross-sectional view of the camera 200. FIG. 2B shows an exploded perspective view of multi-core organic substrate 204 and ceramic substrate 206a of the hybrid sensor shift platform 202. In the illustrated example, the hybrid sensor shift platform 202 includes one multi-core organic substrate 204 and two ceramic substrates 206a and 206b. It should be appreciated, however, that the hybrid sensor shift platform 202 may include a different number of organic substrates and/or a different number of ceramic substrates. As a non-limiting example, the hybrid sensor shift platform 202 may include one multi-core organic substrate and one ceramic substrate in various embodiments.

According to some embodiments, the camera 200 may include a lens group 208 and an image sensor 210. The image sensor 210 may be configured to receive light that has passed through the lens group 208 and convert the captured light into image signals. In various embodiments, the multi-core organic substrate 204 may be the "top" and/or "upper" substrate of the hybrid sensor shift platform 202. For example, the multi-core organic substrate 204 may be positioned above the ceramic substrate 206a (and/or ceramic substrate 206b). The multi-core organic substrate 204 may be positioned closer to the lens group 208, relative to the ceramic substrate 206a. In various embodiments, the ceramic substrate(s) may be considered the "bottom" and/or "lower" substrate(s) of the hybrid sensor shift platform 202. For example, the ceramic substrate 206a and/or the ceramic substrate 206b may be positioned below the multi-core organic substrate 204.

In some embodiments, the ceramic substrate(s) may be coupled with the multi-core organic substrate 204 and with the image sensor 210. For example, as indicated in FIG. 2A, an upper surface of the ceramic substrate 206a may be attached to a bottom surface of the multi-core organic substrate 204 using one or more bonding material(s) 212 (e.g., solder, adhesive, etc.). According to some non-limiting embodiments, the ceramic substrate 206a may be connected via a solder bond process to the multi-core organic substrate 204 with a specific pad definition/arrangement. To take stress off the solder bonds between the multi-core organic substrate 204 and the ceramic substrate 206a, the solder bond connection may be reinforced with an under-fill of epoxy that surrounds the solder bonds, thus creating a full interface between the substrates within their overlap.

Figure 3:
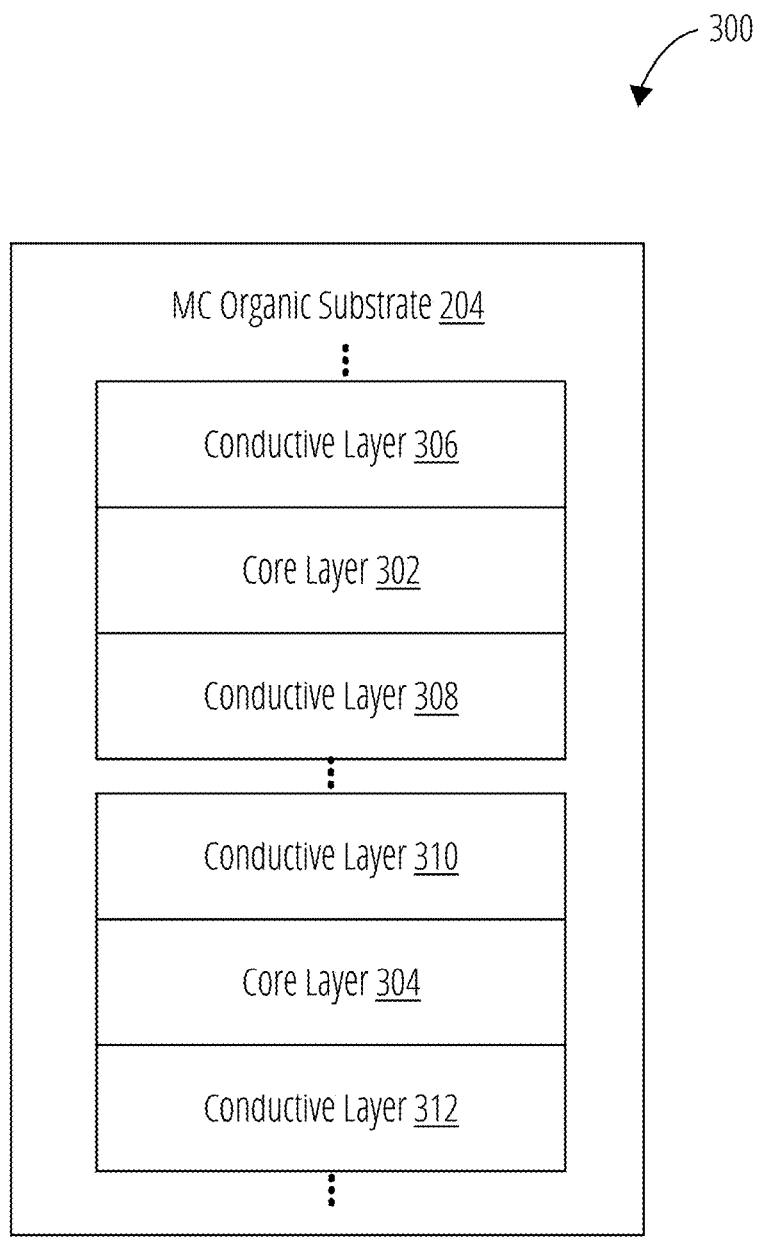
FIG. 3 illustrates a schematic block diagram of an example stack of layers of a multi-core organic substrate that may be included in a hybrid sensor shift platform, in accordance with some embodiments.
Figure 4:
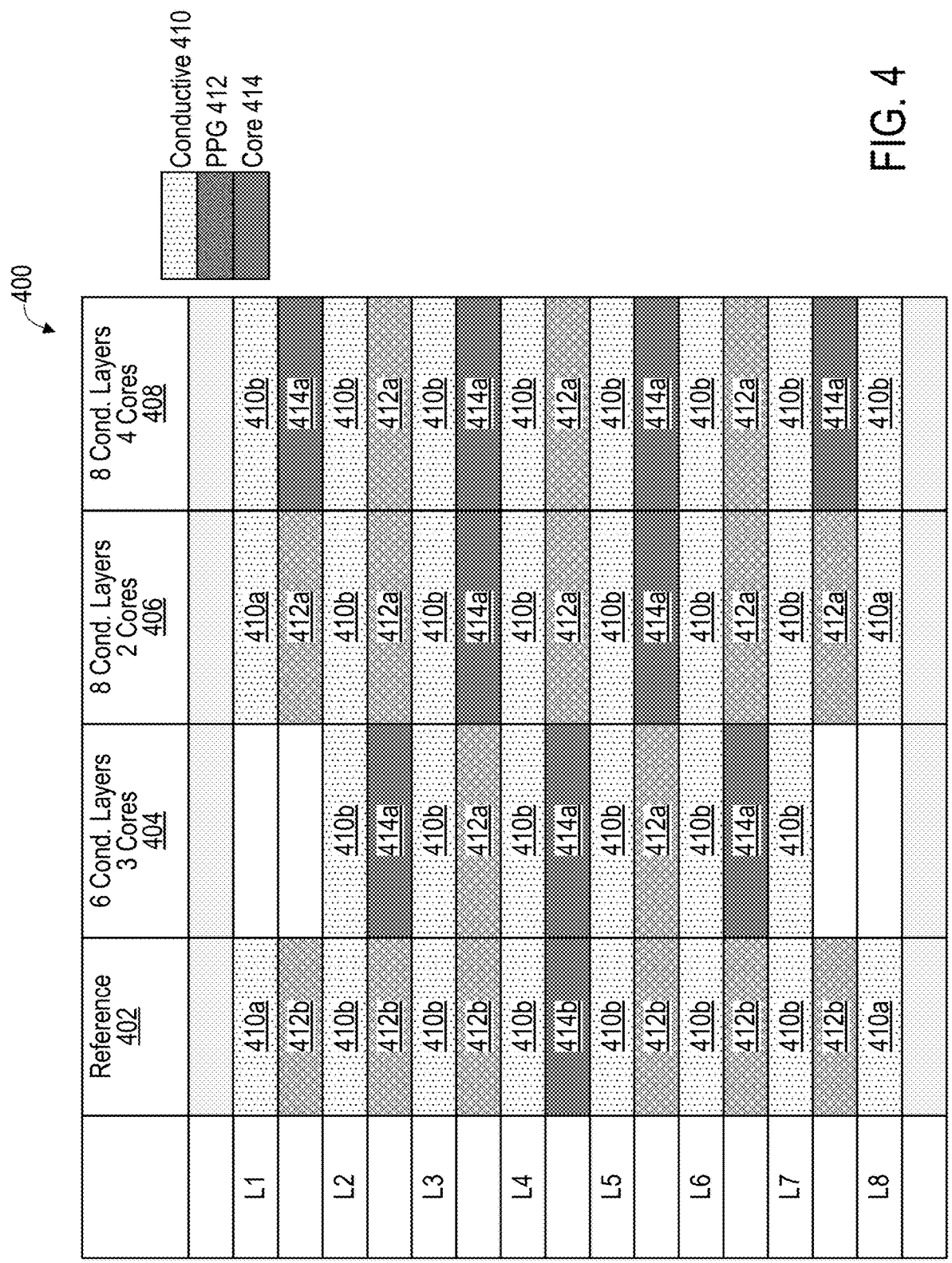
FIG. 4 illustrates a table of stacks of layers of example multi-core organic substrates that may be included in a hybrid sensor shift platform, in accordance with some embodiments.

As discussed in greater detail in FIGS. 3-4, the multi-core organic substrate 204 may be formed of a stack of layers that include multiple core layers (e.g., core layers core layer 302 and 304 in FIG. 3, the core layers shown in FIG. 4, etc.). In various embodiments, the core layers have a different coefficient of thermal expansion (CTE) than other types of layers in the multi-core organic substrate 204. For example, the multi-core organic substrate 204 may include one or more conductive layers (e.g., conductive layers 306, 308, 310, and 312 in FIG. 3, the conductive layers shown in FIG. 4, etc.) and/or one or more prepreg layers (e.g., the prepreg layers shown in FIG. 4). Multiple core layers may be included to adjust (e.g., reduce) the average CTE of the multi-core organic substrate 204 to more closely align the average CTE of the multi-core organic substrate 204 with the CTE of the ceramic substrate 206a, e.g., as compared to an organic substrate that has a single core layer (which may have an average CTE that is significantly higher than the CTE of the ceramic substrate 206a). As previously indicated, the lower the difference between the average CTE of the organic substrate and the CTE of the ceramic substrate, the less warpage may result from the attachment process used to attach the ceramic substrate to the organic substrate in some cases.

Using an organic substrate as the top substrate of the hybrid sensor shift platform 202 may reduce the mass of the hybrid sensor shift platforms 202 when compared to a ceramic sensor shift platform (not shown), for example by 10-20%. The multi-core organic substrate 204 of the hybrid sensor shift platform 202 may be the largest substrate, may be the closest substrate to the VCM magnets, and/or may hold one or more sensor positioning (SP) coils (e.g., SP coil(s) 126, SP sensors, and various other electrical components (not shown)). Since the mass of the hybrid sensor shift platform 202 may be significantly reduced by using an organic material for the top substrate, the magnetic force and thus the power required to move the hybrid sensor shift platform 202 and the thermal heat generated may be significantly reduced when compared to a ceramic sensor shift platform.

Furthermore, magnetic attraction between the hybrid sensor shift platform 202 and the VCM magnets may be significantly reduced as compared to a ceramic sensor shift platform (e.g., by 90-95%). For example, a process used for the ceramic substrate(s) may result in magnetization of the ceramic substrate(s). That process may not be used for the multi-core organic substrate 204 (which may be the closest substrate to the VCM magnets), so the multi-core organic substrate 204 may not be magnetized in the same manner as the ceramic substrate(s).

As previously mentioned, the multi-core organic substrate 204 may be the top substrate of the hybrid sensor shift platform 202 and thus closest to other components of the camera 200 that may contact the hybrid sensor shift platform 202 during a drop event in some embodiments. The multi-core organic substrate 204 of the hybrid sensor shift platform 202 may be more resilient and/or flexible than ceramic material, and thus less prone to fracture. Thus, the hybrid sensor shift hybrid sensor shift platform 202 may be more reliable and less prone to fracture in drop events when compared to a ceramic sensor shift platform.

As compared to a ceramic sensor shift platform, embodiments of the hybrid sensor shift platform 202 may reduce the weight of the sensor shift platform, reduce unwanted magnetic interaction between the sensor shift platform and the VCM magnets, make the sensor shift platform more reliable, and/or may reduce cost of manufacture, while still meeting the overall requirements of the sensor shift platform.

FIG. 2B shows top surfaces of the multi-core organic substrate 204 and the ceramic substrate 206a. Non-limiting example contact points for attaching various components (e.g., SP coil 618 and position sensor 622 in FIG. 6) to the top surface of multi-core organic substrate 204 are indicated as dots on the top surface of multi-core organic substrate 204 in FIG. 2B. Similarly, non-limiting example contact points (that correspond to contact points on the bottom surface (not shown) of the multi-core organic substrate 204) are indicated as dots on the top surface of the ceramic substrate 206a. Contact points on the bottom surface of the multi-core organic substrate 204 may be connected to the corresponding contact points on the top surface of the ceramic substrate 206a via a solder bond process. To take stress off the solder bonds between the multi-core organic substrate 204 and the ceramic substrate 206a, the connection between the substrates may be reinforced with an under-fill of epoxy that surrounds the solder bonds, thus creating a full interface between the multi-core organic substrate 204 and the ceramic substrate 206a within the overlap of the two substrates.

FIG. 3 illustrates a schematic block diagram of an example stack of layers 300 of a multi-core organic substrate (e.g., multi-core organic substrate 204 in FIGS. 2A-2B) that may be included in a hybrid sensor shift platform. In some embodiments, the stack of layers 300 may include multiple core layers, such as core layer 302 and core layer 304. Furthermore, the stack of layers 300 may include multiple conductive layers, such as conductive layers 306, 308, 310, and 312 (e.g., copper layers). It should be appreciated that one or more other types of layers may be included in the stack of layers 300 in various embodiments. For example, as discussed herein with reference to FIG. 4, the multi-core organic substrate may include one or more prepreg layers and/or one or more other types of dielectric layers. In various embodiments, the core layers, conductive layers, and prepreg layers, etc., may comprise corresponding materials used in printed circuit board (PCB) manufacturing.

In various embodiments, the core layers 302 and 304 (and the prepreg layers in FIG. 4) may be dielectric layers that may be disposed between conductive layers. The core layers 302 and 304 may be formed of one or more core materials. In some non-limiting examples, the core layers 302 and 304 may comprise one or more prepreg laminates that are pressed, hardened, and cured. Furthermore, the core layers 302 and 304 may be plated with copper foil on each side. The prepreg layers may be formed of one or more prepreg materials. In various embodiments, a prepreg layer may comprise a composite material made from pre-impregnated fibers (e.g., fibers pre-impregnated with an uncured or partially partially cured polymer matrix). In some embodiments, the fibers are pre-impregnated with a resin (e.g., epoxy resin, phenolic resin, etc.) and/or a thermoplastic mixed with liquid rubbers or resins. The fibers may comprise a weave (e.g., a fiberglass weave).

In some non-limiting embodiments, the core layer 302 and/or the core layer 304 may have a coefficient of thermal expansion (CTE) ranging from 4 to 6 ppm/° C., a laminate thickness ranging from 0.05 to 0.21 mm, a flexural modulus (lengthwise) ranging from 30 to 32 GPa, and/or a dielectric constant ranging from 4.3 to 4.5.

In some non-limiting embodiments, the core layer 302 and/or the core layer 304 may have a CTE ranging from 1.5 to 2 ppm/° C., a laminate thickness ranging from 0.04 to 0.31 mm, a flexural modulus (lengthwise) ranging from 34 to 36 GPa, and/or a dielectric constant ranging from 4.0 to 4.2.

In some non-limiting embodiments, one or more prepreg layers may have a CTE ranging from 8 to 10 ppm/° C. (X) and ranging from 2 to 5 ppm/° C. (Y), and/or a dielectric thickness (after laminate) ranging from 0.021 to 0.040 mm. Additionally, or alternatively, the prepreg layer(s) may comprise glass cloth with a resin content ranging from 73±2 to 84±2%.

In some non-limiting embodiments, one or more prepreg layers may have a CTE ranging from 6 to 7 ppm/° C. (X) and ranging from 2 to 4 ppm/° C. (Y), and/or a dielectric thickness (after laminate) ranging from 0.016 to 0.052 mm. Additionally, or alternatively, the prepreg layer(s) may comprise glass cloth with a resin content ranging from 67±2 to 83±2%.

FIG. 4 illustrates a table 400 of stacks of layers of example multi-core organic substrates that may be included in a hybrid sensor shift platform. In table 400, labels "L1-L8" indicate rows corresponding to conductive layers. The columns of the table 400 correspond to (from left to right): reference 402 (an example single-core organic substrate); a first multi-core organic substrate with six conductive layers and three core layers ("first multi-core stack 404"); a second multi-core organic substrate with eight conductive layers and two core layers ("second multi-core stack 406"); and a third multi-core organic substrate with eight conductive layers and four core layers ("third multi-core stack 408"). As indicated in table 400, the stacks of layers may include conductive layers 410, prepeg ("PPG") layers 412, and/or core layers 414. In table 400, the letters "a" or "b" appended to the reference numerals of the layers, are used to indicate relative thickness, with "b" indicating a greater thickness relative to "a". For example, conductive layers 410b are thicker than conductive layers 410a, PPG layers 412b are thicker than PPG layers 412a, and core layers 414b are thicker than core layers 414a. It should be understood that the stacks of layers shown in table 400 are intended to be non-exhaustive, illustrative examples.

According to various embodiments, the conductive layers 410 may be used for conveying electrical signals and/or for electrical grounding. As a non-limiting example, the conductive layers 410 may be formed of copper. It should be appreciated, however, that other types of conductive materials may be used in various embodiments.

As previously mentioned, multiple core layers 414 may be included in an organic substrate so that the average coefficient of thermal expansion (CTE) of the organic substrate is closer in value to the CTE of a ceramic substrate (that is coupled with the organic substrate to form the hybrid sensor shift platform), which may improve warpage performance (e.g., reduce warpage) of the hybrid sensor shift platform. In various embodiments, the core layers 414 may have a CTE that is lower than the PPG layers 412 and the conductive layers 410. Furthermore, the PPG 412 layers may have a CTE that is lower than the conductive layers 410. To reduce the average CTE of the organic substrate, the layers of the of the organic substrate may be tuned, e.g., by replacing PPG 412 layers with core layers 414, reducing the conductive layer 410 thickness, etc. In various embodiments, layer thicknesses can be changed to adjust parameters such as average CTE and stiffness.

Reference 402 is an organic stack-up that includes eight conductive layers 410a-b (also "L1-L8"), a single core layer 414b in the middle of the stack (between conductive layers L4 and L5), and six PPG layers 412b (each sandwiched between a respective pair of conductive layers 410).

First multi-core stack 404 is an organic stack-up that includes six conductive layers 410b (L2-L7), three core layers 414a, and two PPG layers 412a, as indicated in FIG. 4. The conductive layers 410b in the first multi-core stack 404 have the same thickness as the conductive layers 410b in reference 402. Each of the three core layers 414a in the first multi-core stack 404 is thinner than the single core layer 414b in reference 402. Each of the two PPG layers 412a in the first multi-core stack 404 is thinner than the PPG layers 412b in reference 402.

Second multi-core stack 406 is an organic stack-up that includes eight conductive layers 410a-410b (L1-8), two core layers 414a, and five PPG layers 412a, as indicated in FIG. 4.

Third multi-core stack 408 is an organic stack-up that includes eight conductive layers 410b (L1-L8), four core layers 414a, and three PPG layers 412a, as indicated in FIG. 4.

According to some non-limiting embodiments, the average CTE of a multi-core organic substrate of a hybrid sensor shift platform may be less than 135% of the CTE of the ceramic substrate. According to some non-limiting embodiments, the average CTE of the multi-core organic substrate may be less than 130% of the CTE of the ceramic substrate. Various embodiments disclosed herein may be used to reduce the average CTE of the multi-core organic substrate, thereby reducing a CTE mismatch with the ceramic substrate.

Figure 5:
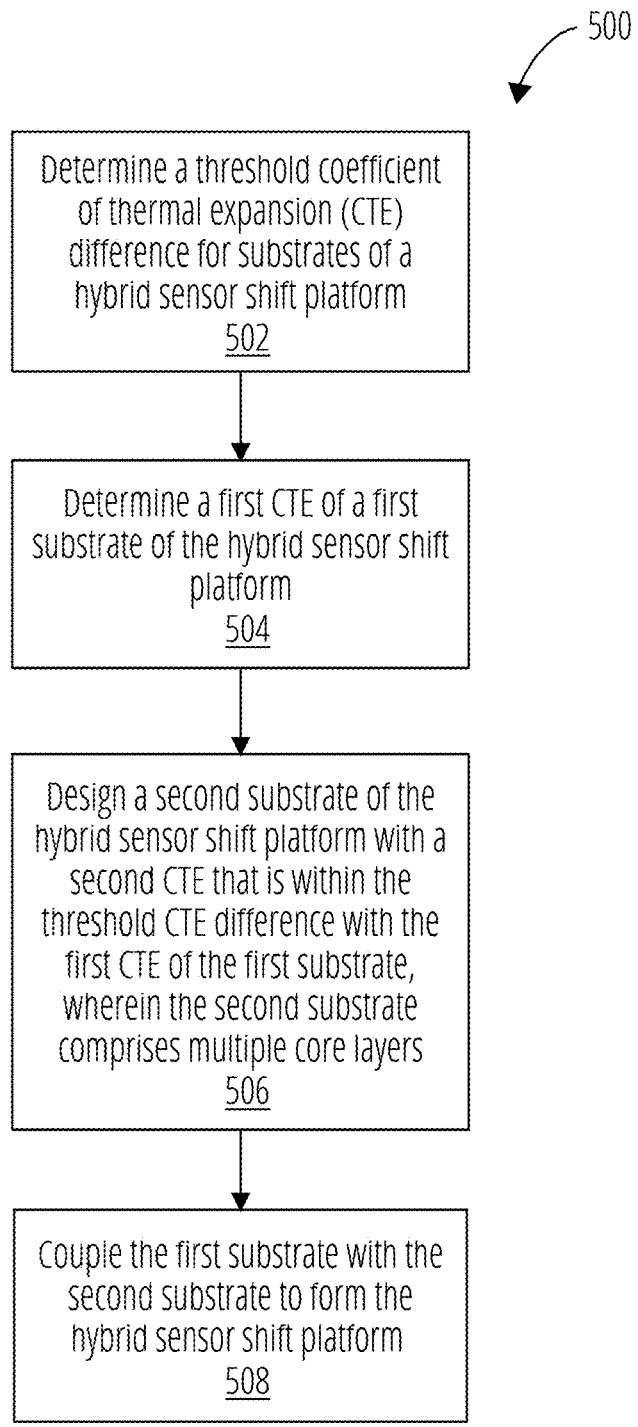
FIG. 5 is a flowchart of an example method of forming a hybrid sensor shift platform that may be included in a camera, in accordance with some embodiments.

FIG. 5 is a flowchart of an example method 500 of forming a hybrid sensor shift platform (e.g., hybrid sensor shift platform 128 in FIGS. 1A-1B, hybrid sensor shift platform 202 in FIG. 2A, etc.) that may be included in a camera (e.g., camera 100 in FIGS. 1A-1B, camera 200 in FIGS. 2A-2B, etc.). It should be understood that in some embodiments one or more operations of method 500 may be omitted, and/or one or more operations may be added. Furthermore, the order of the operations of method 500 may be different than indicated in FIG. 5 in some embodiments.

At 502, the method 500 may include determining a threshold coefficient of thermal expansion (CTE) difference for substrates of a hybrid sensor shift platform. For example, the hybrid sensor shift platform may include a ceramic substrate and an organic substrate. The threshold CTE difference may refer to a threshold difference between the CTE of the ceramic substrate and the average CTE of the organic substrate. This threshold may be a difference in absolute terms, for example. Additionally, or alternatively the threshold may be expressed in proportional/relative terms.

At 504, the method 500 may include determining a first CTE of a first substrate of the hybrid sensor shift platform. For example, the first CTE may be the CTE of a ceramic substrate to be used in the hybrid sensor shift platform for a particular camera design.

At 506, the method 500 may include designing a second substrate of the hybrid sensor shift platform with a second CTE that is within the threshold CTE difference with the first CTE of the first substrate. According to various embodiments, the second substrate may have multiple core layers. For example, the second substrate may be a multi-core organic substrate. As disclosed herein, the layers of the multi-core organic substrate may be tuned (e.g., by inclusion of multiple core layers and/or reduction of copper layer thickness) to reduce the average CTE of the multi-core organic substrate.

At 508, the method 500 may include coupling the first substrate with the second substrate to form the hybrid sensor shift platform. For example, the ceramic substrate may be attached to the multi-core organic substrate using a high-temperature attachment process. Warpage of the hybrid sensor shift platform may be minimized by closely aligning the average CTE of the organic substrate with the CTE of the ceramic substrate.

Figure 6:
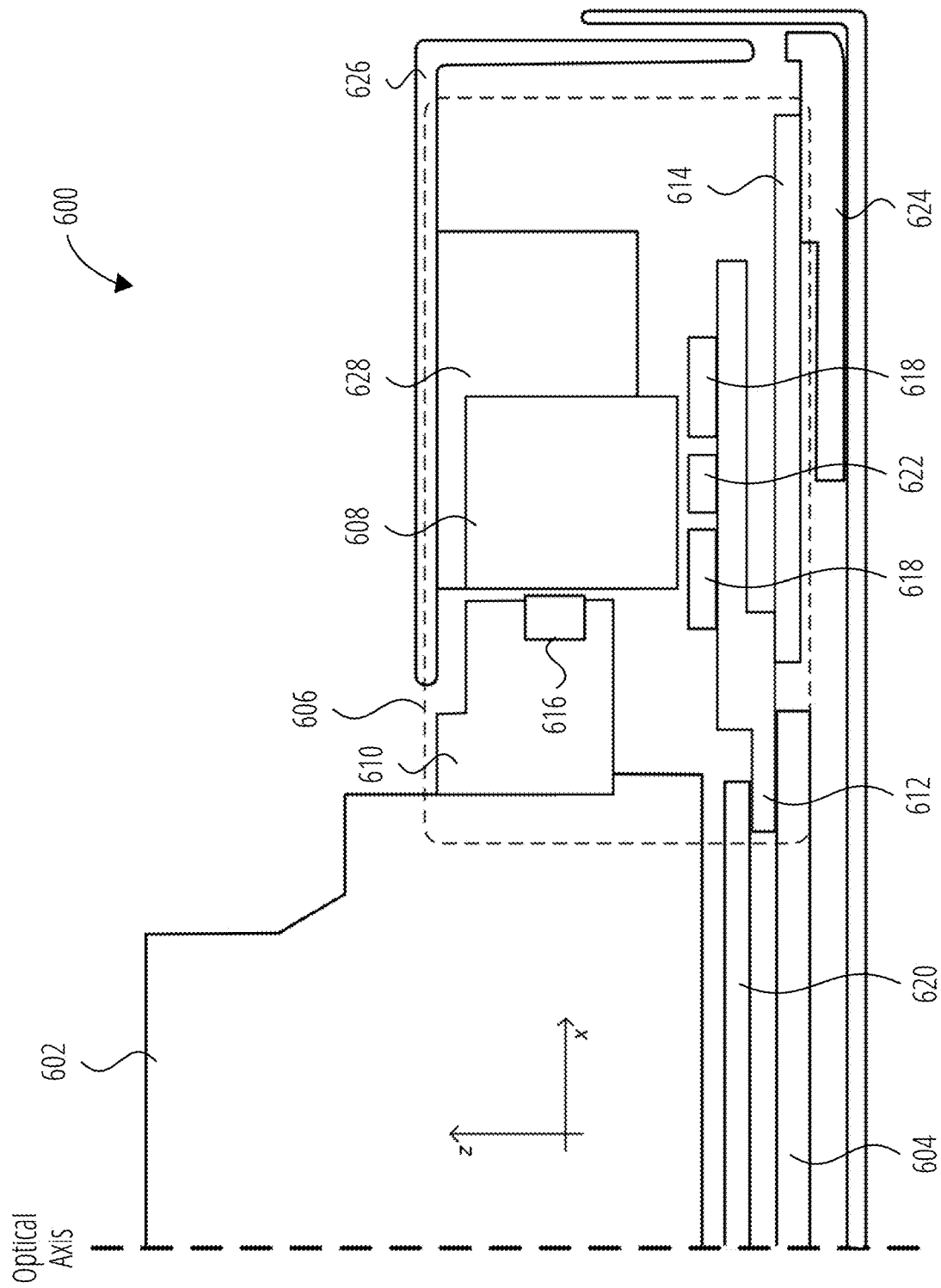
FIG. 6 illustrates a schematic cross-sectional side view of an example camera that may include a hybrid sensor shift platform comprising a multi-core substrate, in accordance with some embodiments.

FIG. 6 illustrates a schematic cross-sectional side view of an example camera 600 that may include a hybrid sensor shift platform comprising a multi-core substrate. In some embodiments, the camera 600 may include a lens group 602, an image sensor 604, and a voice coil motor (VCM) actuator 606. The lens group 602 may define an optical axis. The image sensor 604 may be configured to capture light passing through the lens group 602 and convert the captured light into image signals. In some cases, the VCM actuator module 606 may be one of multiple VCM actuator modules of the camera 600. For instance, the camera 600 may include four such VCM actuator modules 606, such as two pairs of VCM actuator modules 606 that oppose one another relative to the lens group 602. The VCM actuator module(s) 606 may be configured to move the lens group 602 along the optical axis (e.g., in the Z-axis direction, to provide autofocus (AF) functionality) and/or tilt the lens group 602 relative to the optical axis. Furthermore, the VCM actuator module(s) 606 may be configured to move the image sensor 604 in directions orthogonal to the optical axis (e.g., in the X-axis and/or Y-axis directions, to provide optical image stabilization (OIS) functionality).

Figure 7:
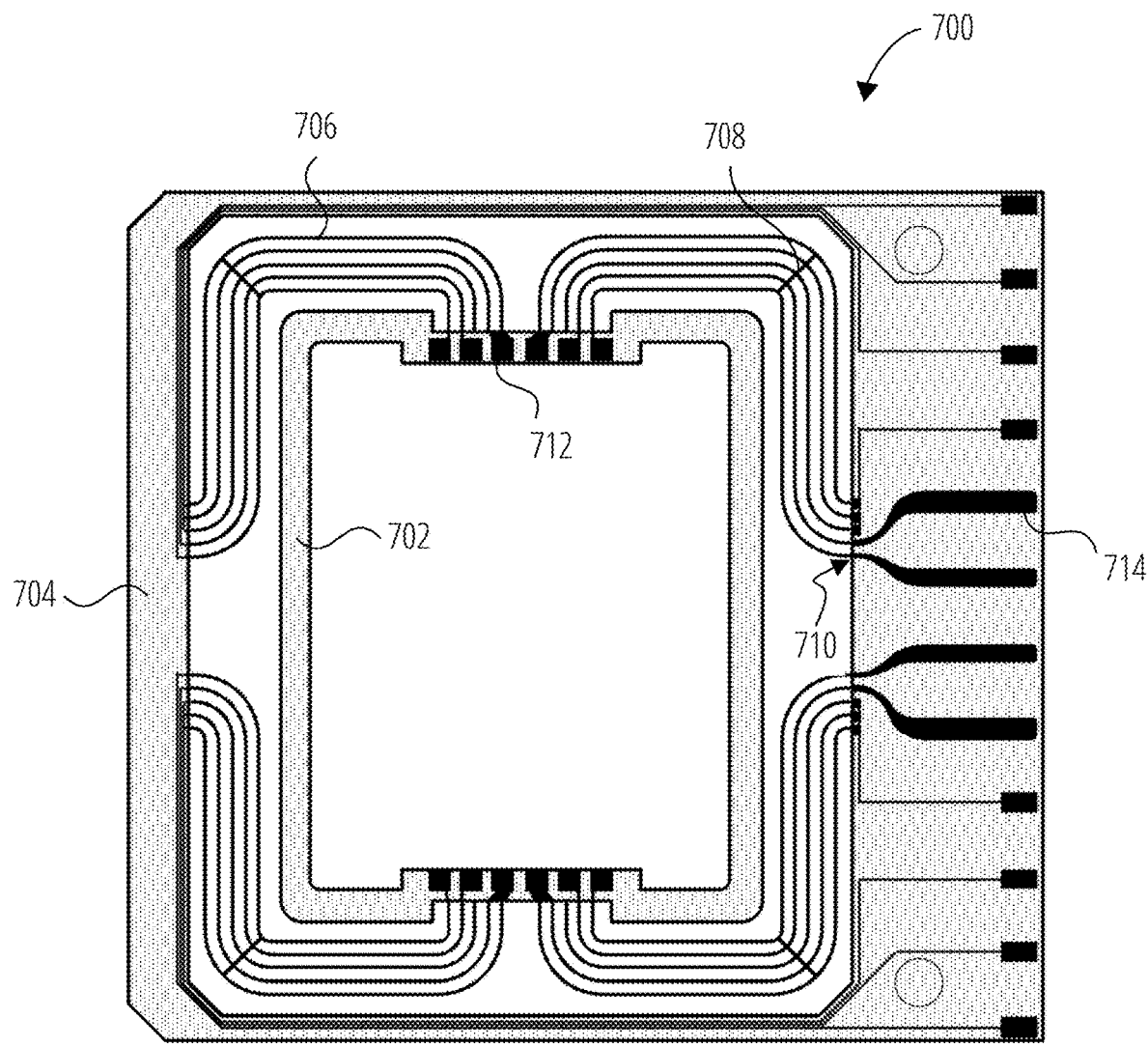
FIG. 7 illustrates a top view of an example flexure that may be coupled with a hybrid sensor shift platform comprising a multi-core substrate, in accordance with some embodiments.

In various embodiments, the VCM actuator module 606 may include a magnet 608 (e.g., a stationary single pole magnet), a lens holder 610, a hybrid sensor shift platform 612, a top flexure (not shown), and a bottom flexure (e.g., bottom flexure(s) 120 in FIG. 1B, flexure 700 in FIG. 7, etc.). Furthermore, the VCM actuator module 606 may include an AF coil 616 and a bottom sensor positioning (SP) coil 618.

In some embodiments, the lens holder 610 may hold, or otherwise support, the AF coil 616 proximate a side of the magnet 608. The lens holder 610 may be coupled to the lens holder 610 such that the lens group 602 shifts together with the lens holder 610.

According to some embodiments, the hybrid sensor shift platform 612 may comprise a multi-core organic substrate and a ceramic substrate. In various embodiments, the hybrid sensor shift platform 612 may hold, or otherwise support, the bottom SP coil 618 proximate a bottom side of the magnet 608. For example, the bottom SP coil 618 may be coupled to the multi-core organic substrate of the hybrid sensor shift platform 612. The hybrid sensor shift platform 612 may be coupled to the image sensor 604 such that the image sensor 604 shifts together with the hybrid sensor shift platform 612. For example, the image sensor 604 may be coupled to the ceramic substrate of the hybrid sensor shift platform 612. In some embodiments, the hybrid sensor shift platform 612 may also be coupled with, or may otherwise support, an infrared cut-off filter (IRCF) 620 (and/or one or more other optical elements), e.g., as indicated in FIG. 6.

In some embodiments, the VCM actuator module 606 may include a position sensor 622 (e.g., a Hall sensor) for position detection based on movement of the SP coil 618 in directions orthogonal to the optical axis. For example, the position sensor 622 may be located on the hybrid sensor shift platform 612 proximate to the SP coil 618.

As also discussed herein with reference to FIG. 7, the flexure 614 may be configured to provide compliance for motion of the hybrid sensor shift platform 612 in directions orthogonal to the optical axis (and/or parallel to an image plane defined by the image sensor 604). Furthermore, the flexure 614 may be configured to suspend the hybrid sensor shift platform 612 and the image sensor 604 from one or more stationary structures 624 of the camera 600.

The top flexure (not shown) may be configured to mechanically and electrically connect the lens holder 610 to the shield can 626 and/or to one or more other stationary structures (e.g., stationary structure 624) of the camera 600. The top flexure may be configured to provide compliance for motion of the lens holder 610 along the optical axis (and/or orthogonal to the image plane) and for tilt of the lens holder 610 relative to the optical axis. The shield can 626 may encase, at least in part, an interior of the camera 600. The shield can 626 may be a stationary component that is static relative to one or more moving components (e.g., the lens holder 610 and hybrid sensor shift platform 612).

In some embodiments, the stationary magnet 608 may be fixed to a stationary structure (e.g., magnet holder 628). In some examples, each of the AF coil 616 and the SP coil 618 may be a race track coil.

Electromagnetic interaction between the AF coil 616 and the magnet 608 may produce Lorentz forces that cause the lens holder 610 to move along the optical axis (and/or orthogonal to the image plane) and/or to tilt relative to the optical axis. Electromagnetic interaction between the SP coil 618 and the magnet 608 may produce Lorentz forces that cause the hybrid sensor shift platform 612 to move in directions orthogonal to the optical axis (and/or parallel to the image plane). The lens group 602 may shift together with (e.g., in lockstep with) the lens holder 610. Furthermore, the image sensor 604 may shift together with (e.g., in lockstep with) the hybrid sensor shift platform 612.

In various embodiments, electrical contacts/connections may allow for electrical signals (e.g., image signals) to be conveyed from the image sensor 604 to a controller (not shown). For instance, the image sensor 604 may be in electrical contact with the hybrid sensor shift platform 612 via one or more contacts, and thus image signals may be conveyed from the image sensor 604 to the hybrid sensor shift platform 612. The image signals may be conveyed from the hybrid sensor shift platform 612 to one or more external components (not shown) that are external to the camera 600, via a flex circuit (not shown) coupled with the flexure 614. According to various examples, electrical contacts/connections may allow for current to be conveyed from the controller to the hybrid sensor shift platform 612 to drive the SP coil 618.

FIG. 7 illustrates atop view of an example flexure 700 (e.g., bottom flexure(s) 120, flexure 214 in FIG. 2A, etc.) that may be coupled with a hybrid sensor shift platform (e.g., hybrid sensor shift platform 128 in FIGS. 1A-1B, hybrid sensor shift platform 202 in FIGS. 2A-2B, etc.) comprising a multi-core substrate. In various embodiments, the flexure 700 may be configured to suspend the hybrid sensor shift platform (together with an image sensor coupled with the hybrid sensor shift platform) from one or more stationary structures of the camera. Additionally, or alternatively, the flexure 700 may be configured to allow motion of the hybrid sensor shift platform enabled by one or more actuators of the camera.

According to some embodiments, the flexure 700 may include an inner frame 702, an outer frame 704, and one or more flexure arms 706. The inner frame 702 may be fixedly coupled with the hybrid sensor shift platform. For example, the inner frame 702 may be fixedly coupled with a ceramic substrate of the hybrid sensor shift platform. The outer frame 704 may be fixedly coupled with one or more stationary structures (e.g., a base structure) of the camera. As indicated in FIG. 7, the outer frame 704 may at least partially encircle the inner frame 702 in some embodiments. The flexure arm(s) 706 may be configured to connect the inner frame 702 to the outer frame 704. The flexure arm(s) 706 may allow the inner frame 702 to move relative to the outer frame 704. The stiffness and/or compliance of the flexure arm(s) 706 may be designed based at least in part on the intended direction(s) of motion of the sensor shift actuation. For example, for optical image stabilization (OIS) motion, the actuator(s) used for sensor shift actuation may be configured to move the sensor shift platform in directions parallel to an image plane defined by the image sensor; thus, the flexure arm(s) 706 may be designed to provide sufficient compliance in the directions parallel to the image plane, and to provide sufficient stiffness in a direction orthogonal to the image plane so as to mitigate motion in that direction if such motion is undesirable.

In some embodiments, the flexure 700 may include one or more flexure stabilizer members 708. The flexure stabilizer member(s) 708 may be configured to mechanically connect flexure arms 706 to each other so as to prevent interference between the flexure arms 706 that are connected by the flexure stabilizer member(s) 708. For instance, the flexure stabilizer member(s) 708 may be configured to prevent the flexure arms 706 from colliding and/or entangling with one another, e.g., in drop events, vibration events, etc. Additionally, or alternatively, the flexure stabilizer member(s) 708 may be configured to limit motion of, and/or stabilize relative motion between, the flexure arms 706 that are connected by the flexure stabilizer member(s) 708. Furthermore, the flexure stabilizer member(s) 708 may be arranged along various portions of the flexure arms 706 to provide in-plane stiffness as needed in the flexure 700, e.g., to satisfy OIS design requirements in some embodiments.

In various embodiments, one or more of the flexure arm(s) 706 may include electrical traces (e.g., electrical trace 710) configured to convey electrical signals between the inner frame 702 and the outer frame 704. In some embodiments, the electrical traces may be routed, via one or more flexure arms 706 and/or one or more flexure stabilizer members 708, from one or more electrical connection elements 712 disposed on the inner frame 702 to one or more electrical connection elements 714 disposed on the outer frame 704.

Figure 8:
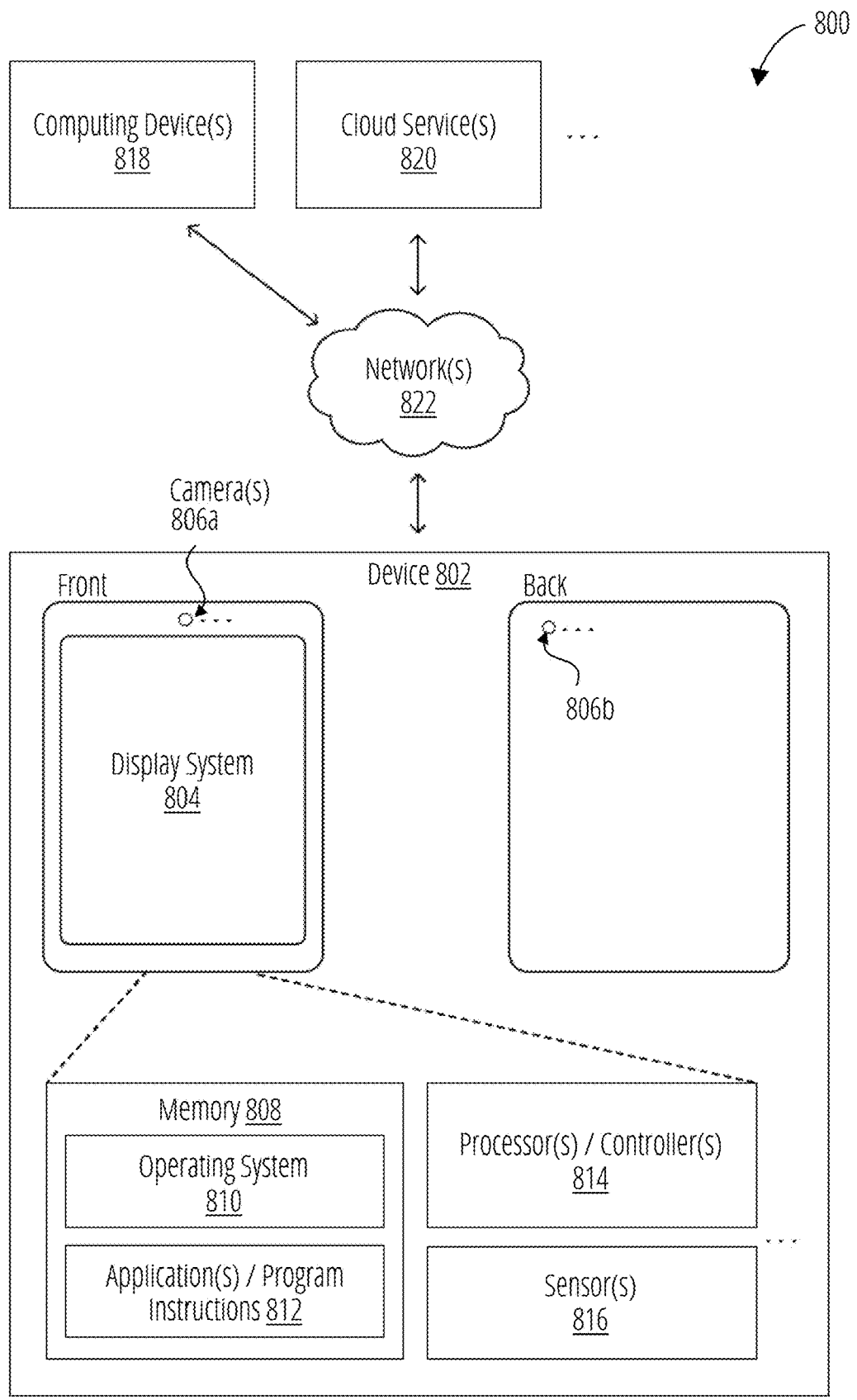
FIG. 8 illustrates a schematic representation of an example environment comprising a device that may include a camera with a hybrid sensor shift platform comprising a multi-core substrate, in accordance with some embodiments.

FIG. 8 illustrates a schematic representation of an example environment 600 comprising a device 802 that may include one or more cameras. For example, the device 802 may include a camera system having a hybrid sensor shift platform comprising a multi-core organic substrate, e.g., as described herein with reference to FIGS. 1A-7. In some embodiments, the device 802 may be a mobile device and/or a multifunction device. In various embodiments, the device 802 may be any of various types of devices, including, but not limited to, a personal computer system, desktop computer, laptop, notebook, tablet, slate, pad, or netbook computer, mainframe computer system, handheld computer, workstation, network computer, a camera, a set top box, a mobile device, an augmented reality (AR) and/or virtual reality (VR) headset, a consumer device, video game console, handheld video game device, application server, storage device, a television, a video recording device, a peripheral device such as a switch, modem, router, or in general any type of computing or electronic device.

In some embodiments, the device 802 may include a display system 804 (e.g., comprising a display and/or a touch-sensitive surface) and/or one or more cameras memory 806. In some non-limiting embodiments, the display system 804 and/or one or more front-facing cameras 606a may be provided at a front side of the device 802, e.g., as indicated in FIG. 8. Additionally, or alternatively, one or more rear-facing cameras 806b may be provided at a rear side of the device 802. In some embodiments comprising multiple cameras 806, some or all of the cameras 806 may be the same as, or similar to, each other. Additionally, or alternatively, some or all of the cameras 806 may be different from each other. In various embodiments, the location(s) and/or arrangement(s) of the camera(s) 806 may be different than those indicated in FIG. 8.

Among other things, the device 802 may include memory 808 (e.g., comprising an operating system 810 and/or application(s)/program instructions 812), one or more processors and/or controllers 814 (e.g., comprising CPU(s), memory controller(s), display controller(s), and/or camera controller(s), etc.), and/or one or more sensors 816 (e.g., orientation sensor(s), proximity sensor(s), and/or position sensor(s), etc.). In some embodiments, the device 802 may communicate with one or more other devices and/or services, such as computing device(s) 818, cloud service(s) 820, etc., via one or more networks 822. For example, the device 802 may include a network interface (e.g., network interface 912 in FIG. 9) that enables the device 802 to transmit data to, and receive data from, the network(s) 822. Additionally, or alternatively, the device 802 may be capable of communicating with other devices via wireless communication using any of a variety of communications standards, protocols, and/or technologies.

Figure 9:
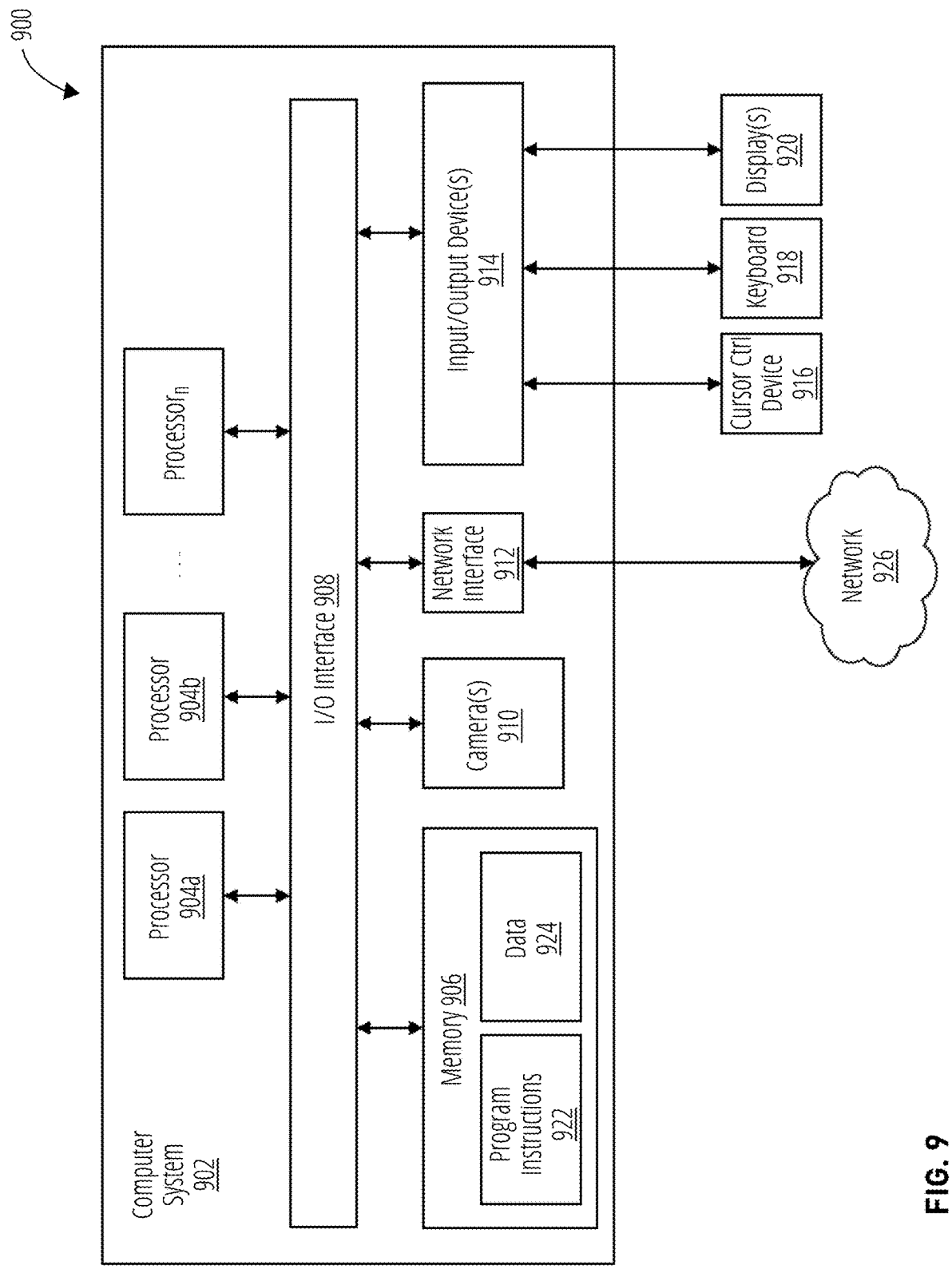
FIG. 9 illustrates a schematic block diagram of an example environment comprising a computer system that may include a camera with a hybrid sensor shift platform comprising a multi-core substrate, in accordance with some embodiments.

FIG. 9 illustrates a schematic block diagram of an example environment 700 comprising a computer system 902 that may include a camera with a hybrid sensor shift platform comprising a multi-core substrate, e.g., as described herein with reference to FIGS. 1A-8. In addition, computer system 902 may implement methods for controlling operations of the camera and/or for performing image processing on images captured with the camera. In some embodiments, the device 802 (described herein with reference to FIG. 8) may additionally, or alternatively, include some or all of the functional components of the described herein.

The computer system 902 may be configured to execute any or all of the embodiments described above. In different embodiments, computer system 902 may be any of various types of devices, including, but not limited to, a personal computer system, desktop computer, laptop, notebook, tablet, slate, pad, or netbook computer, mainframe computer system, handheld computer, workstation, network computer, a camera, a set top box, a mobile device, an augmented reality (AR) and/or virtual reality (VR) headset, a consumer device, video game console, handheld video game device, application server, storage device, a television, a video recording device, a peripheral device such as a switch, modem, router, or in general any type of computing or electronic device.

In the illustrated embodiment, computer system 902 includes one or more processors 704 coupled to a system memory 906 via an input/output (I/O) interface 708. Computer system 902 further includes one or more cameras 910 coupled to the I/O interface 908. Computer system 702 further includes a network interface 912 coupled to I/O interface 908, and one or more input/output devices 914, such as cursor control device 916, keyboard 918, and display(s) 920. In some cases, it is contemplated that embodiments may be implemented using a single instance of computer system 902, while in other embodiments multiple such systems, or multiple nodes making up computer system 902, may be configured to host different portions or instances of embodiments. For example, in one embodiment some elements may be implemented via one or more nodes of computer system 902 that are distinct from those nodes implementing other elements.

In various embodiments, computer system 902 may be a uniprocessor system including one processor 904, or a multiprocessor system including several processors 904 (e.g., two, four, eight, or another suitable number). Processors 904 may be any suitable processor capable of executing instructions. For example, in various embodiments processors 904 may be general-purpose or embedded processors implementing any of a variety of instruction set architectures (ISAs), such as the x86, PowerPC, SPARC, or MIPS ISAs, or any other suitable ISA. In multiprocessor systems, each of processors 904 may commonly, but not necessarily, implement the same ISA.

System memory 906 may be configured to store program instructions 822 accessible by processor 904. In various embodiments, system memory 906 may be implemented using any suitable memory technology, such as static random access memory (SRAM), synchronous dynamic RAM (SDRAM), nonvolatile/Flash-type memory, or any other type of memory. Additionally, existing camera control data 924 of memory 906 may include any of the information or data structures described above. In some embodiments, program instructions 922 and/or data 924 may be received, sent or stored upon different types of computer-accessible media or on similar media separate from system memory 906 or computer system 902. In various embodiments, some or all of the functionality described herein may be implemented via such a computer system 902.

In one embodiment, I/O interface 908 may be configured to coordinate I/O traffic between processor 904, system memory 906, and any peripheral devices in the device, including network interface 912 or other peripheral interfaces, such as input/output devices 914. In some embodiments, I/O interface 908 may perform any necessary protocol, timing or other data transformations to convert data signals from one component (e.g., system memory 906) into a format suitable for use by another component (e.g., processor 904). In some embodiments, I/O interface 908 may include support for devices attached through various types of peripheral buses, such as a variant of the Peripheral Component Interconnect (PCI) bus standard or the Universal Serial Bus (USB) standard, for example. In some embodiments, the function of I/O interface 908 may be split into two or more separate components, such as a north bridge and a south bridge, for example. Also, in some embodiments some or all of the functionality of I/O interface 908, such as an interface to system memory 906, may be incorporated directly into processors 904.

Network interface 912 may be configured to allow data to be exchanged between computer system 902 and other devices attached to a network 926 (e.g., carrier or agent devices) or between nodes of computer system 902. Network 926 may in various embodiments include one or more networks including but not limited to Local Area Networks (LANs) (e.g., an Ethernet or corporate network), Wide Area Networks (WANs) (e.g., the Internet), wireless data networks, some other electronic data network, or some combination thereof. In various embodiments, network interface 912 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output device(s) 914 may, in some embodiments, include one or more display terminals, keyboards, keypads, touchpads, scanning devices, voice or optical recognition devices, or any other devices suitable for entering or accessing data by one or more computer systems 902. Multiple input/output devices 914 may be present in computer system 902 or may be distributed on various nodes of computer system 902. In some embodiments, similar input/output devices may be separate from computer system 902 and may interact with one or more nodes of computer system 902 through a wired or wireless connection, such as over network interface 912.

Those skilled in the art will appreciate that computer system 902 is merely illustrative and is not intended to limit the scope of embodiments. In particular, the computer system and devices may include any combination of hardware or software that can perform the indicated functions, including computers, network devices, Internet appliances, PDAs, wireless phones, pagers, etc. Computer system 902 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 902 may be transmitted to computer system 902 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium. Generally speaking, a computer-accessible medium may include a non-transitory, computer-readable storage medium or memory medium such as magnetic or optical media, e.g., disk or DVD/CD-ROM, volatile or non-volatile media such as RAM (e.g., SDRAM, DDR, RDRAM, SRAM, etc.), ROM, etc. In some embodiments, a computer-accessible medium may include transmission media or signals such as electrical, electromagnetic, or digital signals, conveyed via a communication medium such as network and/or a wireless link.

The following clauses describe various

Clause 1. A hybrid sensor shift platform, comprising:
    a ceramic substrate; and
    a multi-core organic substrate attached to the ceramic substrate, wherein the multi-core organic substrate comprises:
        a stack of layers, comprising:
            a plurality of conductive layers formed of one or more conductive materials; and
            a plurality of core layers formed of one or more core materials;
        wherein the sensor shift platform is configured to be fixedly coupled with an image sensor of a camera, such that the image sensor is movable together with the hybrid sensor shift platform.

Clause 2. The hybrid sensor shift platform of clause 1, wherein:
    the plurality of conductive layers comprises:
        a first pair of conductive layers; and
        a second pair of conductive layers; and
    the plurality of core layers comprises:
        a first core layer sandwiched between the first pair of conductive layers; and
        a second core layer sandwiched between the second pair of conductive layers.

Clause 3. The hybrid sensor shift platform of claim 1, wherein the stack of layers of the multi-core organic substrate further comprises:
one or more prepreg layers formed of one or more prepreg materials.

Clause 4. The hybrid sensor shift platform of clause 1, wherein the ceramic substrate is configured to be fixedly coupled with the image sensor.

Clause 5. The hybrid sensor shift platform of clause 4, wherein the multi-core organic substrate is fixedly attached to the ceramic substrate by solder bonds.

Clause 6. The hybrid sensor shift platform of clause 1, wherein:
the stack of layers of the multi-core organic substrate further comprises:
a plurality of prepreg layers formed of one or more prepreg materials;
and
the plurality of conductive layers comprises:
a first conductive layer sandwiched between a first prepreg layer of the plurality of prepreg layers and the first core layer; and
a second conductive layer sandwiched between a second prepreg layer of the plurality of prepreg layers and the second core layer.

Clause 7. The hybrid sensor shift platform of clause 1, wherein the plurality of conductive layers comprises one or more copper layers.

Clause 8. The hybrid sensor shift platform of clause 1, wherein:
the plurality of conductive layers comprises six copper layers; and
the plurality of core layers comprises three core layers.

Clause 9. The hybrid sensor shift platform of clause 8, wherein the stack of layers of the multi-core organic substrate further comprises:
two prepreg layers formed of one or more prepreg materials.

Clause 10. The hybrid sensor shift platform of clause 1, wherein:
the plurality of conductive layers comprises eight copper layers; and
the plurality of core layers comprises two core layers.

Clause 11. The hybrid sensor shift platform of clause 10, wherein the stack of layers of the multi-core organic substrate further comprises:
five prepreg layers formed of one or more prepreg materials.

Clause 12. The hybrid sensor shift platform of clause 1, wherein:
the plurality of conductive layers comprises eight copper layers; and
the plurality of core layers comprises four core layers.

Clause 13. The hybrid sensor shift platform of clause 12, wherein the stack of layers of the multi-core organic substrate further comprises:
three prepreg layers formed of one or more prepreg materials.

Clause 14. The hybrid sensor shift platform of clause 1, wherein the hybrid sensor shift platform is configured to be coupled with a flexure of the camera that suspends the hybrid sensor shift platform from a stationary structure of the camera and that allows motion of the hybrid sensor shift platform enabled by an actuator of the camera.

Clause 15. The hybrid sensor shift platform of clause 1, wherein the average coefficient of thermal expansion (CTE) of the multi-core organic substrate is less than 135% of the CTE of the ceramic substrate.

Clause 16. The hybrid sensor shift platform of clause 1, wherein the average CTE of the multi-core organic substrate is less than 130% of the CTE of the ceramic substrate.

Clause 17. A camera, comprising:
a lens group comprising one or more lens elements;
an image sensor;
an actuator to move the image sensor relative to the lens group; and
a hybrid sensor shift platform fixedly coupled with the image sensor such that the image sensor is movable together with the hybrid sensor shift platform, wherein the hybrid sensor shift platform comprises:
a ceramic substrate; and
a multi-core organic substrate attached to the ceramic substrate, wherein the multi-core organic substrate comprises:
a stack of layers, comprising:
1. a plurality of conductive layers formed of one or more conductive materials; and
2. a plurality of core layers formed of one or more core materials.

Clause 18. The camera of clause 17, wherein:
the plurality of conductive layers comprises:
a first pair of conductive layers; and
a second pair of conductive layers; and
the plurality of core layers comprises:
a first core layer sandwiched between the first pair of conductive layers; and
a second core layer sandwiched between the second pair of conductive layers.

Clause 19. The camera of clause 17, wherein the stack of layers of the multi-core organic substrate further comprises:
one or more prepreg layers formed of one or more prepreg materials.

Clause 20. The camera of clause 17, wherein the ceramic substrate is configured to be fixedly coupled with the image sensor.

Clause 21. The camera of clause 17, wherein:
the stack of layers of the multi-core organic substrate further comprises:
a plurality of prepreg layers formed of one or more prepreg materials;
and
the plurality of conductive layers comprises:
a first conductive layer sandwiched between a first prepreg layer of the plurality of prepreg layers and the first core layer; and
a second conductive layer sandwiched between a second prepreg layer of the plurality of prepreg layers and the second core layer.

Clause 22. The camera of clause 17, further comprising:
a flexure that suspends the hybrid sensor shift platform from a stationary structure of the camera and that allows motion of the hybrid sensor shift platform enabled by the actuator, wherein the flexure comprises:
an inner frame fixedly coupled with the ceramic substrate;
an outer frame fixedly coupled with the stationary structure; and
one or more flexure arms that connect the inner frame with the outer frame.

Clause 23. The camera of clause 17, wherein the actuator comprises:
a voice coil motor (VCM) actuator, comprising:
one or more magnets; and
one or more coils configured to electromagnetically interact with the one or more magnets to produce Lorentz forces that move the hybrid sensor shift platform in at least one of:
a direction parallel to an optical axis of the camera; or
directions orthogonal to the optical axis.

Clause 24. The camera of clause 23, wherein at least a portion of the VCM actuator is fixedly coupled with the hybrid sensor shift platform.

Clause 25. The camera of clause 24, wherein the one or more coils are mounted on the multi-core organic substrate of the hybrid sensor shift platform.

Clause 26. The camera of clause 24, wherein the one or more magnets are mounted on the multi-core organic substrate of the hybrid sensor shift platform.

Clause 27. A device, comprising:
one or more processors;
memory storing program instructions executable by the one or more processors to control operations of a camera; and
the camera, comprising:
a lens group comprising one or more lens elements;
an image sensor;
an actuator to move the image sensor relative to the lens group; and
a hybrid sensor shift platform fixedly coupled with the image sensor such that the image sensor is movable together with the hybrid sensor shift platform, wherein the hybrid sensor shift platform comprises:
a ceramic substrate; and
a multi-core organic substrate attached to the ceramic substrate, wherein the multi-core organic substrate comprises:
3. a stack of layers, comprising:
a plurality of conductive layers formed of one or more conductive materials; and
a plurality of core layers formed one or more core materials.

Clause 28. The device of clause 27, wherein:
the plurality of conductive layers comprises:
a first pair of conductive layers; and
a second pair of conductive layers; and
the plurality of core layers comprises:
a first core layer sandwiched between the first pair of conductive layers; and
a second core layer sandwiched between the second pair of conductive layers.

Clause 29. The device of clause 27, wherein the stack of layers of the multi-core organic substrate further comprises:
one or more prepreg layers formed of one or more prepreg materials.

Clause 30. The device of clause 27, wherein the ceramic substrate is configured to be fixedly coupled with the image sensor.

Clause 31. The device of clause 27, wherein:
the stack of layers of the multi-core organic substrate further comprises:
a plurality of prepreg layers formed of one or more prepreg materials; and
the plurality of conductive layers comprises:
a first conductive layer sandwiched between a first prepreg layer of the plurality of prepreg layers and the first core layer; and
a second conductive layer sandwiched between a second prepreg layer of the plurality of prepreg layers and the second core layer.

Clause 32. The device of clause 27, wherein the camera further comprises:
a flexure that suspends the hybrid sensor shift platform from a stationary structure of the camera and that allows motion of the hybrid sensor shift platform enabled by the actuator, wherein the flexure comprises:
an inner frame fixedly coupled with the ceramic substrate;
an outer frame fixedly coupled with the stationary structure; and
one or more flexure arms that connect the inner frame with the outer frame.

Clause 33. The device of clause 32, wherein the actuator is configured to move the hybrid sensor shift platform in directions parallel to an image plane defined by the image sensor.

Clause 34. The device of clause 32, wherein the actuator is configured to move the hybrid sensor shift platform in at least one direction orthogonal to an image plane defined by the image sensor.

The methods described herein may be implemented in software, hardware, or a combination thereof, in different embodiments. In addition, the order of the blocks of the methods may be changed, and various elements may be added, reordered, combined, omitted, modified, etc. Various modifications and changes may be made as would be obvious to a person skilled in the art having the benefit of this disclosure. The various embodiments described herein are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the example configurations may be implemented as a combined structure or component. These and other variations, modifications, additions, and improvements may fall within the scope of embodiments as defined in the claims that follow.

What is claimed is:
1. A hybrid sensor shift platform, comprising:
a ceramic substrate; and
a multi-core organic substrate attached to the ceramic substrate, wherein the multi-core organic substrate comprises:
a stack of layers, comprising:
a plurality of conductive layers formed of one or more conductive materials; and
a plurality of core layers formed of one or more core materials;
wherein the sensor shift platform is configured to be fixedly coupled with an image sensor of a camera, such that the image sensor is movable together with the hybrid sensor shift platform.

2. The hybrid sensor shift platform of claim 1, wherein:
the plurality of conductive layers comprises:
- a first pair of conductive layers; and
- a second pair of conductive layers; and the plurality of core layers comprises:
- a first core layer sandwiched between the first pair of conductive layers; and
- a second core layer sandwiched between the second pair of conductive layers.

3. The hybrid sensor shift platform of claim 1, wherein the stack of layers of the multi-core organic substrate further comprises:
one or more prepreg layers formed of one or more prepreg materials.

4. The hybrid sensor shift platform of claim 1, wherein:
the stack of layers of the multi-core organic substrate further comprises:
- a plurality of prepreg layers formed of one or more prepreg materials; and the plurality of conductive layers comprises:
- a first conductive layer sandwiched between a first prepreg layer of the plurality of prepreg layers and the first core layer; and
- a second conductive layer sandwiched between a second prepreg layer of the plurality of prepreg layers and the second core layer.

5. The hybrid sensor shift platform of claim 1, wherein the hybrid sensor shift platform is configured to be coupled with a flexure of the camera that suspends the hybrid sensor shift platform from a stationary structure of the camera and that allows motion of the hybrid sensor shift platform enabled by an actuator of the camera.

6. The hybrid sensor shift platform of claim 1, wherein the average coefficient of thermal expansion (CTE) of the multi-core organic substrate is less than 135% of the CTE of the ceramic substrate.

7. The hybrid sensor shift platform of claim 1, wherein the average CTE of the multi-core organic substrate is less than 130% of the CTE of the ceramic substrate.

8. A camera, comprising:
a lens group comprising one or more lens elements;
an image sensor;
an actuator to move the image sensor relative to the lens group; and
a hybrid sensor shift platform fixedly coupled with the image sensor such that the image sensor is movable together with the hybrid sensor shift platform, wherein the hybrid sensor shift platform comprises:
- a ceramic substrate; and
- a multi-core organic substrate attached to the ceramic substrate, wherein the multi-core organic substrate comprises:
  a stack of layers, comprising:
  - a plurality of conductive layers formed of one or more conductive materials; and
  - a plurality of core layers formed of one or more core materials.

9. The camera of claim 8, wherein:
the plurality of conductive layers comprises:
- a first pair of conductive layers; and
- a second pair of conductive layers; and the plurality of core layers comprises:
- a first core layer sandwiched between the first pair of conductive layers; and
- a second core layer sandwiched between the second pair of conductive layers.

10. The camera of claim 8, wherein the ceramic substrate is configured to be fixedly coupled with the image sensor.

11. The camera of claim 8, wherein:
the stack of layers of the multi-core organic substrate further comprises:
- a plurality of prepreg layers formed of one or more prepreg materials; and the plurality of conductive layers comprises:
- a first conductive layer sandwiched between a first prepreg layer of the plurality of prepreg layers and the first core layer; and
- a second conductive layer sandwiched between a second prepreg layer of the plurality of prepreg layers and the second core layer.

12. The camera of claim 8, further comprising:
a flexure that suspends the hybrid sensor shift platform from a stationary structure of the camera and that allows motion of the hybrid sensor shift platform enabled by the actuator, wherein the flexure comprises:
- an inner frame fixedly coupled with the ceramic substrate;
- an outer frame fixedly coupled with the stationary structure; and
- one or more flexure arms that connect the inner frame with the outer frame.

13. The camera of claim 8, wherein the actuator comprises:
a voice coil motor (VCM) actuator, comprising:
- one or more magnets; and
- one or more coils configured to electromagnetically interact with the one or more magnets to produce Lorentz forces that move the hybrid sensor shift platform in at least one of:
  - a direction parallel to an optical axis of the camera; or
  - directions orthogonal to the optical axis.

14. The camera of claim 13, wherein the one or more coils are mounted on the multi-core organic substrate of the hybrid sensor shift platform.

15. The camera of claim 13, wherein the one or more magnets are mounted on the multi-core organic substrate of the hybrid sensor shift platform.

16. A device, comprising:
one or more processors;
memory storing program instructions executable by the one or more processors to control operations of a camera; and
the camera, comprising:
a lens group comprising one or more lens elements;
an image sensor;
an actuator to move the image sensor relative to the lens group; and
a hybrid sensor shift platform fixedly coupled with the image sensor such that the image sensor is movable together with the hybrid sensor shift platform, wherein the hybrid sensor shift platform comprises:
- a ceramic substrate; and
- a multi-core organic substrate attached to the ceramic substrate, wherein the multi-core organic substrate comprises:
  a stack of layers, comprising:
  - a plurality of conductive layers formed of one or more conductive materials; and
  - a plurality of core layers formed one or more core materials.

17. The device of claim 16, wherein:
the plurality of conductive layers comprises:
- a first pair of conductive layers; and
- a second pair of conductive layers; and the plurality of core layers comprises:
- a first core layer sandwiched between the first pair of conductive layers; and
- a second core layer sandwiched between the second pair of conductive layers.

18. The device of claim 16, wherein the camera further comprises:
- a flexure that suspends the hybrid sensor shift platform from a stationary structure of the camera and that allows motion of the hybrid sensor shift platform enabled by the actuator, wherein the flexure comprises:
  - an inner frame fixedly coupled with the ceramic substrate;
  - an outer frame fixedly coupled with the stationary structure; and
  - one or more flexure arms that connect the inner frame with the outer frame.

19. The device of claim 18, wherein the actuator is configured to move the hybrid sensor shift platform in directions parallel to an image plane defined by the image sensor.

20. The device of claim 18, wherein the actuator is configured to move the hybrid sensor shift platform in at least one direction orthogonal to an image plane defined by the image sensor.

* * * * *